(12) United States Patent
Fujita et al.

(10) Patent No.: US 7,391,272 B2
(45) Date of Patent: Jun. 24, 2008

(54) VOLTAGE CONTROLLED OSCILLATOR WITH FULL ADDER

(75) Inventors: Ken Fujita, Tokyo (JP); Yuko Murase, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 78 days.

(21) Appl. No.: 11/285,384

(22) Filed: Nov. 23, 2005

(65) Prior Publication Data

US 2007/0115069 A1    May 24, 2007

(51) Int. Cl.
*H03B 5/12* (2006.01)
(52) U.S. Cl. .............. 331/36 C; 331/167; 331/176; 331/177 V
(58) Field of Classification Search ............ 331/36 C, 331/117 R, 167, 177 V, 176
See application file for complete search history.

(56) References Cited

U.S. PATENT DOCUMENTS

| | | | | |
|---|---|---|---|---|
| 6,587,005 | B2 * | 7/2003 | Ichihara | 331/16 |
| 6,806,781 | B2 * | 10/2004 | Bisanti et al. | 331/36 R |
| 6,927,637 | B1 * | 8/2005 | Koh et al. | 331/17 |
| 6,946,924 | B2 * | 9/2005 | Chominski | 331/177 V |
| 7,116,183 | B2 * | 10/2006 | Wu | 331/176 |

FOREIGN PATENT DOCUMENTS

JP    2002-223149    8/2002

OTHER PUBLICATIONS

Chih-Ming Hung, et al. "Fully Integrated 5.35-GHz CMOS VCOs and Prescalers", IEEE Transactions on Microwave Theory and Techniques, vol. 49, No. 1, Jan. 1, 2001, pp. 17-22.

* cited by examiner

*Primary Examiner*—Robert J. Pascal
*Assistant Examiner*—Levi Gannon
(74) *Attorney, Agent, or Firm*—Studebaker & Brackett PC; Donald R. Studebaker

(57) ABSTRACT

A voltage controlled oscillator includes a resonant circuit, a trimming capacitor and a full adder. The resonant circuit includes a negative resistor, an inductor and an oscillation frequency setting capacitor having a variable capacitance according to a controlled voltage based on a oscillation frequency data. The trimming capacitor is connected in parallel to the oscillation frequency setting capacitor. The trimming capacitor has capacitors each of which has a variable capacitance according to an input signal thereof. The full adder is connected to the trimming capacitor. The full adder generates the input signal based on frequency information and an automatic proofreading value received thereto.

17 Claims, 11 Drawing Sheets

| FINAL VALUE | n=3 | RESPONSE | n=2 | RESPONSE | n=1 | RESPONSE | n=0 | RESPONSE |
|---|---|---|---|---|---|---|---|---|
| 0000 | 1000 | 0 | 0100 | 0 | 0010 | 0 | 0001 | 0 |
| 0001 | 1000 | 0 | 0100 | 0 | 0010 | 0 | 0001 | 1 |
| 0010 | 1000 | 0 | 0100 | 0 | 0010 | 1 | 0011 | 0 |
| 0011 | 1000 | 0 | 0100 | 0 | 0010 | 1 | 0011 | 1 |
| 0100 | 1000 | 0 | 0100 | 1 | 0110 | 0 | 0101 | 0 |
| 0101 | 1000 | 0 | 0100 | 1 | 0110 | 0 | 0101 | 1 |
| 0110 | 1000 | 0 | 0100 | 1 | 0110 | 1 | 0111 | 0 |
| 0111 | 1000 | 0 | 0100 | 1 | 0110 | 1 | 0111 | 1 |
| 1000 | 1000 | 1 | 1100 | 0 | 1010 | 0 | 1001 | 0 |
| 1001 | 1000 | 1 | 1100 | 0 | 1010 | 0 | 1001 | 1 |
| 1010 | 1000 | 1 | 1100 | 0 | 1010 | 1 | 1011 | 0 |
| 1011 | 1000 | 1 | 1100 | 0 | 1010 | 1 | 1011 | 1 |
| 1100 | 1000 | 1 | 1100 | 1 | 1110 | 0 | 1101 | 0 |
| 1101 | 1000 | 1 | 1100 | 1 | 1110 | 0 | 1101 | 1 |
| 1110 | 1000 | 1 | 1100 | 1 | 1110 | 1 | 1111 | 0 |
| 1111 | 1000 | 1 | 1100 | 1 | 1110 | 1 | 1111 | 1 |

Fig. 4

| OSCILLATION FREQUENCY (MHz) | FREQUENCY INFORMATION [1:0] | FREQUENCY INFORMATION S | FREQUENCY INFORMATION A |
|---|---|---|---|
| 4800-4859 | (1 1) | 0 | 1 |
| 4860-4919 | (00) | 0 | 0 |
| 4920- | (01) | 1 | 0 |

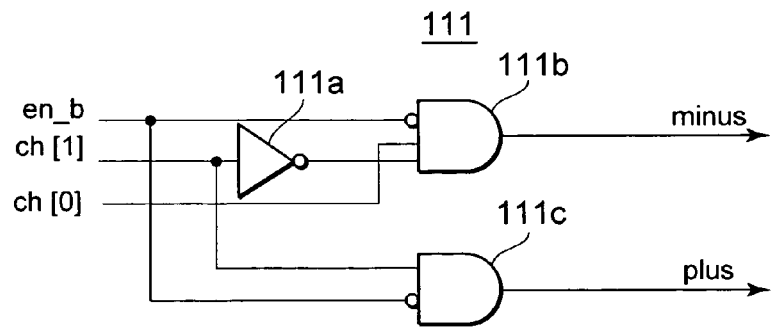
Fig. 11
| Freq.(MHz) | ch [1] | ch [0] | minus | plus |
|---|---|---|---|---|
| 4800-4859 | 1 | 1 | 0 | 1 |
| 4860-4919 | 0 | 0 | 0 | 0 |
| 4920- | 0 | 1 | 1 | 0 |
Fig. 12
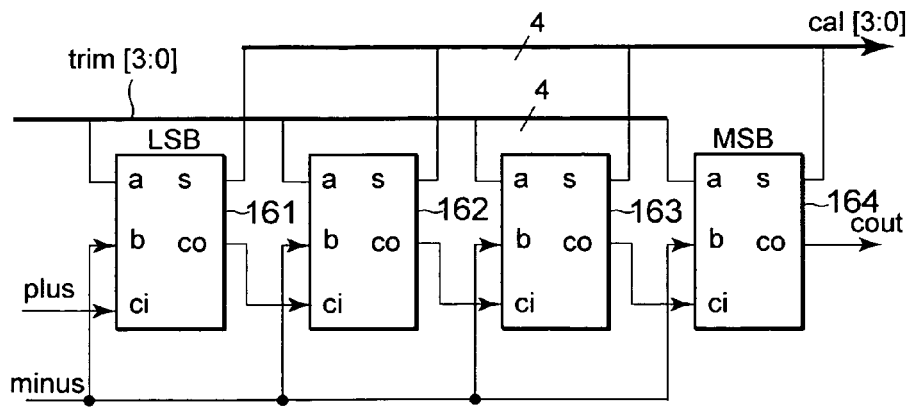
Fig. 13

|  | temp[1] | temp[0] |
|---|---|---|
| T>290K | 0 | 0 |
| T>320K | 0 | 1 |
| T>350K | 1 | 1 |

VOLTAGE CONTROLLED OSCILLATOR WITH FULL ADDER

CROSS-REFERENCE TO RELATED APPLICATION

The present invention relates to copending application Ser. No. 10/810,596, filed on Mar. 29, 2004 whose inventor is one of the inventors of the present invention.

BACKGROUND OF THE INVENTION

The present invention relates to temperature change of a voltage controlled oscillator, especially the voltage controlled oscillator (VCO) used in a PLL circuit, and to a compensation of a temperature variation of the VCO and a frequency characteristic due to an element manufacturing variation.

One of the inventors of the present invention, Mr. Ken Fujita proposed a voltage controlled oscillator in FIG. 9 of the above copending application. The copending application was published after a priority date of the present invention. Hereinafter, the voltage controlled oscillator shown in FIG. 9 is called as "the proposed VCO".

The proposed VCO includes a negative resistor 31, an inductor 32, an oscillation frequency setting capacitor 33 and a buffering circuit 36. The negative resistor 31, the inductor 32 and the capacitor 33 constitute a resonant circuit. The capacitor 33 is a variable capacitance type capacitor and has a voltage control terminal for varying a capacitance value. The capacitance of the capacitor 33 is varied according to the LPF voltage. The buffering circuit 36 is a buffer circuit for preventing buffering between the resonant circuit and a circuit on the output side.

The proposed VCO further includes temperature compensating capacitors 34 and 35 and device characteristic compensating capacitors 38 through 41 and a monitor circuit 37. The device characteristic compensating capacitors 38 through 41 are respectively variable capacitances for adjusting a shift in oscillation frequency band due to variations in device characteristic. The monitor circuit 37 is a circuit for monitoring an LPF voltage. The circuit compares a reference voltage corresponding to a design value of an LPF voltage necessary to output an oscillation frequency set by frequency data (division ratio N) at a desired temperature and an actual LPF voltage and outputs the result thereof as a monitor output 37.

As described above, the proposed VCO has two temperature compensating capacitors and four device characteristic compensating capacitors for temperature. The temperature compensating capacitors and the device characteristic compensating capacitors are generically called as trimming capacitors.

Since a minimum capacitance of the trimming capacitors is not the infinitesimal, when the number of trimming capacitors increases, two or more floating capacity unrelated to a trimming signal (a digital signal) will be connected in parallel with LC resonator. In case the total sum value of the floating capacity cannot disregard compared with the variable range of the variable capacitor, when performing frequency control with sufficient accuracy, a problem arises.

For example, when an oscillation frequency is 2.5 GHz, element constants of the LC circuit are 2 nH and about 2 pF, respectively, and the floating capacity value of the trimming capacitor is about 1 pF. However, if the oscillation frequency is set to about 5 GHz, the element constants of the LC circuit should be set to 1 nH and about 1 pF, respectively, and the floating capacitance of the trimming capacitor should become the same degree of the variable range of the variable capacitor. Therefore, in case the oscillation frequency becomes high, a problem arises by including many trimming capacitors like before.

FIG. 2 shows frequency curves that could be switched by changing the capacitance of the trimming capacitor. For example, where a frequency range required for the oscillation circuit sets to 4800 to 5000 MHz, a first frequency curve 31 can be chosen between 4800 and 4860 MHz, a second frequency curve 32 can be chosen between 4860 and 4920 MHz, and a third frequency curve 33 can be chosen above 4920 MHz. By the above selection function, frequency sensitivity can be controlled to about 100 MHz/V, and a phase noise of the oscillator is also controlled. In many LC resonators with high oscillation frequency, the trimming capacitor connected to the LC resonator is used for the change of the frequency curves.

It is not easy to switch the frequency curves with sufficient reproducibility to desired oscillation frequency. Because, there are many change factors, such as a variation in the floating capacitance and a rate of amplification of many elements which constitute the oscillator, and a temperature change of the sauce/drain capacitance of the negative resistance. Especially, the influence of the floating capacitance of the trimming capacitor is significant.

SUMMARY OF THE INVENTION

One of the objects of the present invention is for providing a voltage controlled oscillator having both of a changing function of frequency curves, and a compensation function for a variation of the frequency curve due to the element variation.

The above and further objects and novel features of the invention will more fully appear from the following detailed description, appended claims and accompanying drawings.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

FIG. 4 is a table showing an example of a calculation of an automatic proofreading value;

FIG. 11 is a circuit diagram showing a frequency curve switch judging circuit;

FIG. 12 is a truth table value of the frequency curve switch judging circuit shown in FIG. 11;

FIG. 13 is a circuit diagram showing a full adder included in the logic synthesis circuit shown in FIG. 10;

DETAILED DESCRIPTION OF THE PREFERRED EMBODIMENT

Hereafter, the preferred embodiment form of this invention is explained with reference to a drawing. In addition, each drawing is roughly shown in the grade which can understand this invention.

(1) First Embodiment

Figure 1:
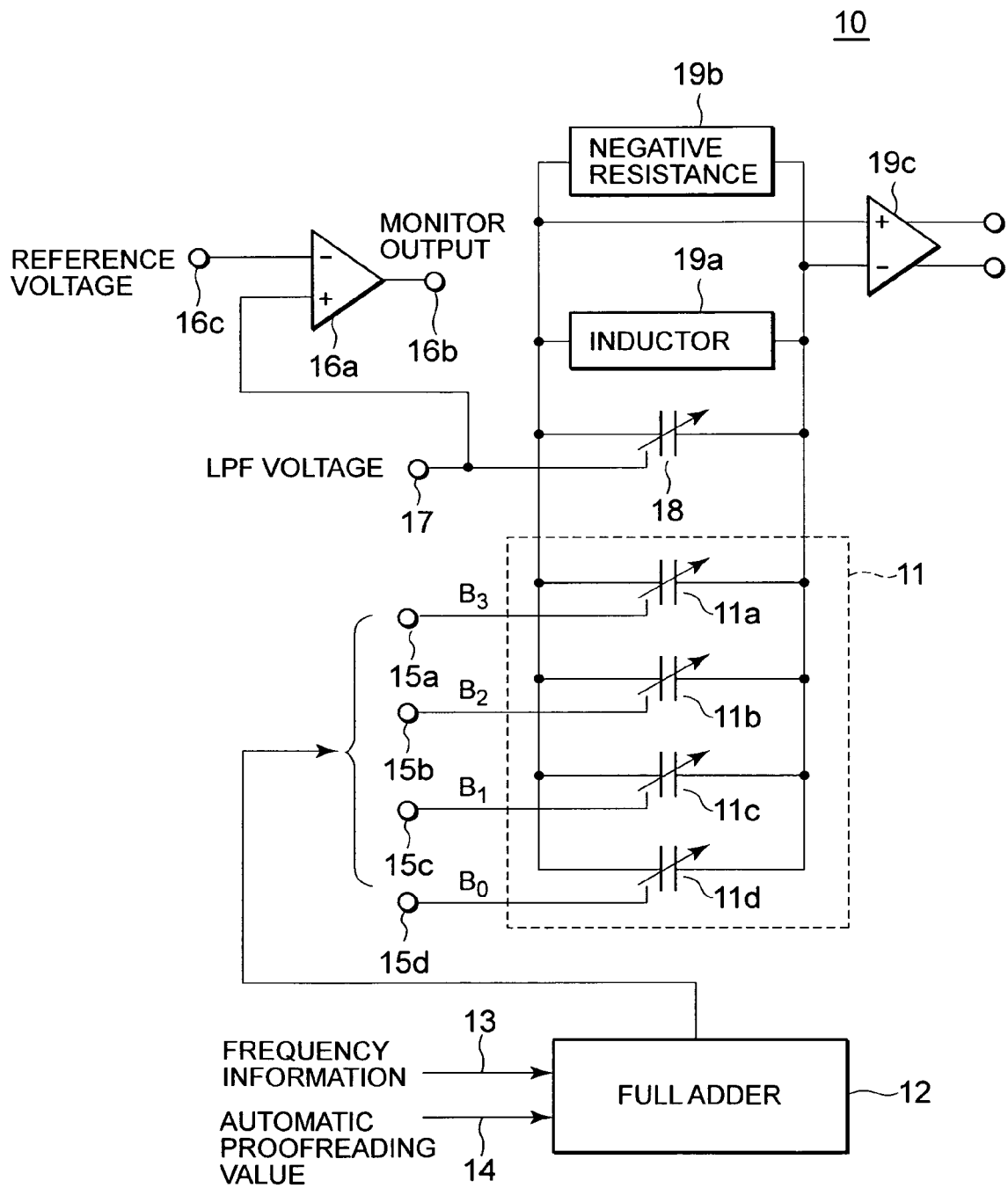
FIG. 1 is a circuit diagram showing a VCO of the first embodiment of the present invention.
Figure 2:
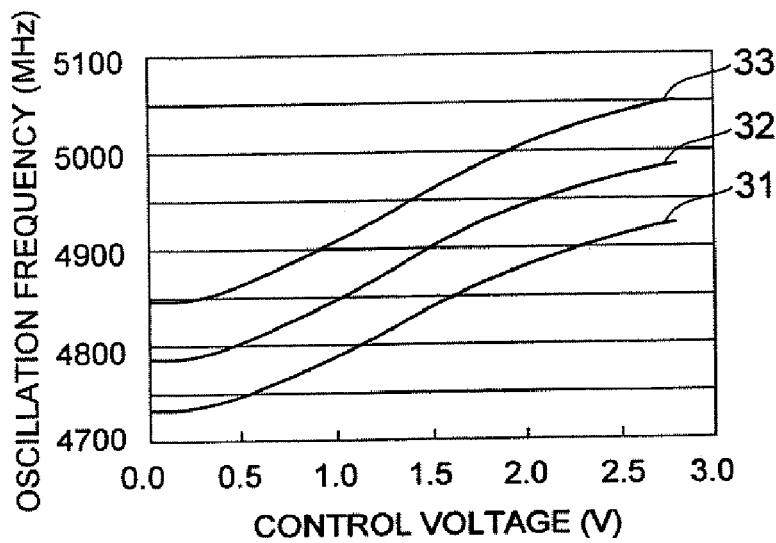
FIG. 2 is a graph showing frequency curves that can be switched by changing a capacitance of a trimming capacitor.

FIG. 1 is a circuit diagram showing the VCO according to the first embodiment of the present invention. The VCO 10 realizes a change of frequency curves and an element variation compensation using trimming capacitors 11 for changing the frequency curves.

The VCO 10 includes the trimming capacitors 11, a full adder 12, a monitor circuit 16a, an oscillation frequency setting capacitor 18, an inductor 19a, a negative resistor 19b and a buffering circuit 19c. The inductor 19a, the negative resistor 19b, and the capacitor 18 constitute a resonant circuit. The negative resistor 19b comprises, for example, transistors that constitute a positive feedback loop. The capacitor 18 is a variable capacitance type capacitor and has a voltage control terminal 17 for varying a capacitance value. A low pass filter (LPF) voltage (described in later) is applied to the voltage control terminal 17. The capacitance of the capacitor 18 is varied according to the LPF voltage. The buffering circuit 19c is a buffer circuit for preventing buffering between the resonant circuit and a circuit on the output side. The buffer circuit fetches out a signal oscillated by the resonant circuit and outputs an oscillation frequency signal.

The monitor circuit 16a is a circuit for monitoring the LPF voltage. The monitor circuit 16a compares a reference voltage applied on one input terminal 16c of the monitor circuit 16a with the LPF voltage applied to the voltage control terminal that is connected to the other input terminal of the monitor circuit 16a. The monitor circuit 16a outputs a result of the comparison at an output terminal 16b thereof as a monitor output. The reference voltage is set to a design value of the LPF voltage necessary to output an oscillation frequency set by frequency data (division ratio N) at a desired temperature.

The trimming capacitors 11 include four variable capacitors 11a to 11d connected in parallel to the capacitor 18. Capacitance of each of the capacitors 11a to 11d is controlled by a voltage applied on voltage control terminals 15a to 15d. The control terminals 15a to 15d are connected to an output of the full adder 12. Each of the capacitance of the capacitors 11a to 11d is set to a second power value. For example, if the capacitor 11a has a capacitance C, the capacitor 11b has a capacitance 2C, the capacitor 11c has a capacitance 4C and the capacitor 11d has a capacitance 8C.

Full adder 12 receives frequency information 13 and an automatic proofreading value 14 (an optimum value of the element variation compensation). The full adder 12 logically synthesizes the inputted values and outputs four bit logical synthesized data to the terminals 15a to 15d.

Figure 3:
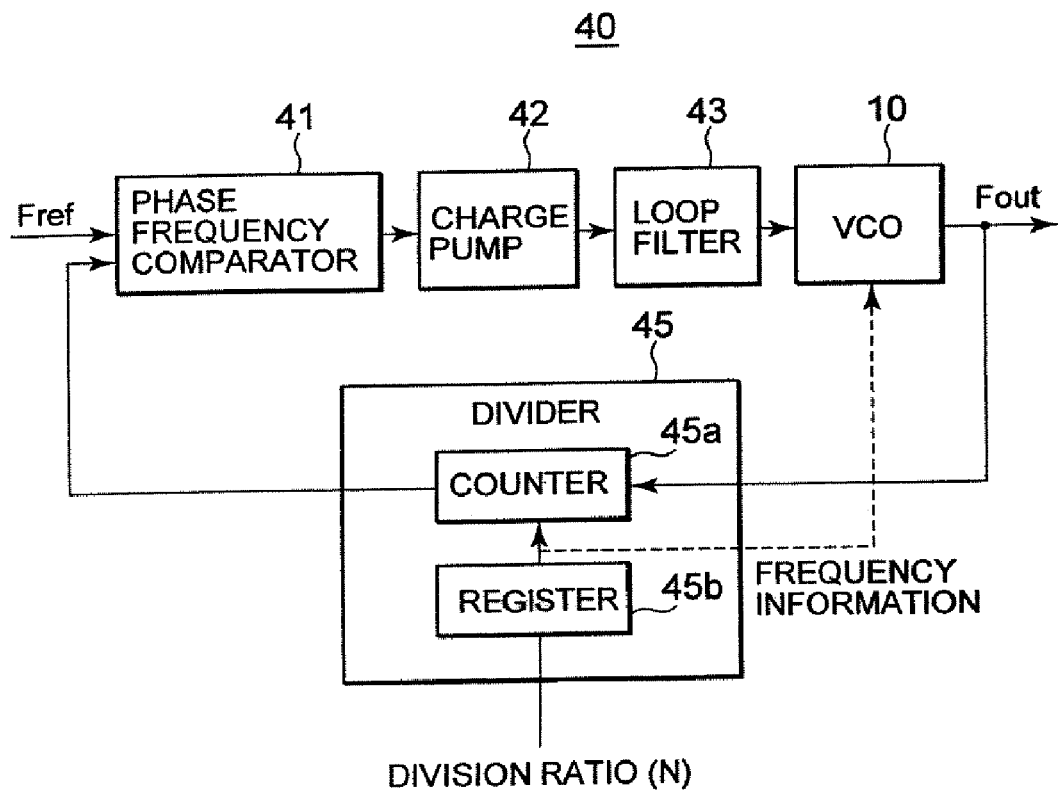
FIG. 3 is a block diagram showing a phase synchronous loop (PLL) circuit including the VCO of the first embodiment of the present invention.

FIG. 3 is a block diagram of an oscillator circuit 40 in which the VCO 10 according to the first embodiment is used. The oscillator circuit 40 is contained in a wireless integrated circuit mounted in a wireless apparatus such as a wireless local area network (LAN) and determines a carrier frequency of a radio wave in accordance with the oscillation frequency of an output signal of the oscillator circuit 40.

The oscillator circuit 40 is a phase locked loop type oscillator circuit. The oscillator circuit 40 includes a phase locked loop comprising a phase frequency comparator 41, a charge pump 42, a loop filter 43, the VCO 10 and a divider 45. The phase comparator 41 outputs a signal corresponding to a difference in phase between a reference frequency signal having a reference frequency Fref and a frequency division signal corresponding to the output of the divider 45 in voltage or current form. The charge pump 42 magnitudes a revel of the output signal of the phase comparator 41. The loop filter 43 is a low pass filter (LPF), which effects smoothing (averaging) on the output of the phase comparator 41. Since the voltage outputted from the loop filter 2 is equivalent to the output of the LPF here, the output voltage of the loop filter 2 will be called "LPF voltage". The voltage-controlled oscillator 10 outputs an oscillation frequency signal having an output frequency Fout. The frequency Fref and the frequency Fout has a following relationship:

$$Fout = N \times Fref$$

Wherein N is a division ratio of the divider 45. The divider 45 is configured of, for example, a programmable counter, which divides the frequency of the oscillation frequency signal Fout into 1/N. When the divider 45 sets the division ratio N, the register 45b receives and stores the division ratio N from a control circuit (not shown).

The oscillator circuit 40 feeds back the division signal obtained by dividing the output of the voltage-controlled oscillator 10 into 1/N by the divider 45 to the phase comparator 41 and performs feedback control in such a manner that the reference frequency signal and the division signal coincide in phase with each other, thereby outputting the oscillation frequency Fout equivalent to N times the reference frequency Fref. The setting of the oscillation frequency is carried out by causing the register 45b to set the division ratio N to the divider 45. If the value of the division ratio N is changed, then the oscillation frequency is changed.

Next, a setting of the automatic proofreading value 14 is explained with using a table shown in FIG. 4.

Firstly, the initial value of the automatic proofreading value is set to (1000) and data of a fourth-order bit is temporarily set to 1 (initial value: n=3). When the frequency pull-in is executed at this value, the monitor output becomes 0. This corresponds to a case in which the oscillation frequency band of the oscillator circuit 40 is excessively higher than the set value. Since there is a need to increase the capacitance value of the capacitor 11d, corresponding to the fourth-order bit and shift the oscillation frequency to the low frequency side, data of the fourth-order bit is set to the monitor output 0, and the following third-order bit is temporarily set to 1 (n=2). On the other hand, when the monitor output is 1, the oscillation frequency band of the oscillator circuit 40 is excessively lower than the set value. Therefore, the data of the fourth-order bit is set to a monitor output 1, the capacitance value of the capacitor 11*d*, corresponding to the fourth-order bit is reduced and the oscillation frequency is shifted to the high frequency side.

That is, the value (1 or 0) of the monitor output is set to an nth-order bit being in trial, as a determined value as it is. 1 is temporarily set to a bit to be tried next. The response at a trial value for the second time becomes 0. In a manner similar to the above, a third-order bit is determined as 0 and a second-order bit is temporarily set to 1 (n=1).

The response at a trial value for the third time becomes 0. In a manner similar to the above, a second-order bit is determined as 0 and a first-order bit is temporarily set to 1 (n=4).

The response at a trial value for the fourth time becomes 0. In a manner similar to the above, a first-order bit is determined as 0 and the final value of the four bit logical synthesized data is determined as (0000).

That is, when the responses for the first to fourth times are changed to 0, 0, 0, and 0 as mentioned above, the final value of the automatic proofreading value is given as (0000). Combinations of other responses (monitor outputs) are also similar to the above. Temporary setting, frequency pull-in and determination of values for monitor outputs are repeated from an upper-order bit to a lower-order bit, so that the automatic proofreading value can be determined.

According to the above algorithm, the automatic proofreading value of n bits can be calculated by trials of n times. The composite capacitance of the capacitors 11 can be expressed in a $2^n$ gradation. That is, many levels of gradation or gray ($2^n$) can be represented with a less number of trials n. In the present embodiment, the four bit logical synthesized data can be determined by the number of trials corresponding to four times. The four bit logical synthesized data can be expressed in a $2^4$ (16) gradation.

Then, a determination method of the automatic proofreading value 14 is explained.

(S1) At a step S1, a division ratio of the divider 45 shown in FIG. 3 is determined. That is, an oscillation frequency of the VCO is determined. For example, in order to obtain the oscillation frequency of 4900 MHz, using standard frequency Fref of 1 MHz, a value 4900 is set in the register 45*b*. The counter counts up to 4900 by making an output signal of the VCO as a clock signal. The counter outputs a count signal as a division signal to the comparator 41.

(S2) Control data (B3, B2, B1, B0)=(1000) is given to an input terminal 15*a* to 15*d* as an initial value of the variable capacitors 11 for the element variation compensation.

(S3) In order to change the data of the bit of the n-th place of the four bit logical synthesized data (hereinafter, the control data), it is first referred to as n=3.

(S4) The n-th bit of the control data is set as "1" (High: power supply voltage) (in the case of n=3, the 3rd bit is already set as "1" by initial value setup).

(S5) The PLL and an oscillator are operated, and it stands by until oscillation frequency settles down (for example, 500 microsec).

(S6) The value at the monitor output terminal 16*b* is read (refer to the response column of FIG. 4), and it considers as the definite value of the n-th bit. The monitor circuit 16*a* consists of comparators which inputted reference voltage into one input terminal (reverse input terminal), and inputted the LPF voltage into the other input terminal (non-reverse input terminal).

(S7) 1 is subtracted from the value of n.

(S8) In the case of n>0, processing steps of (S4) through (S7) is repeated.

(S9) In the case of n=0, let the value of the control data determined at the step (S8) be the definite value of an automatic proofreading value (4 bits).

Figures 5, 6:
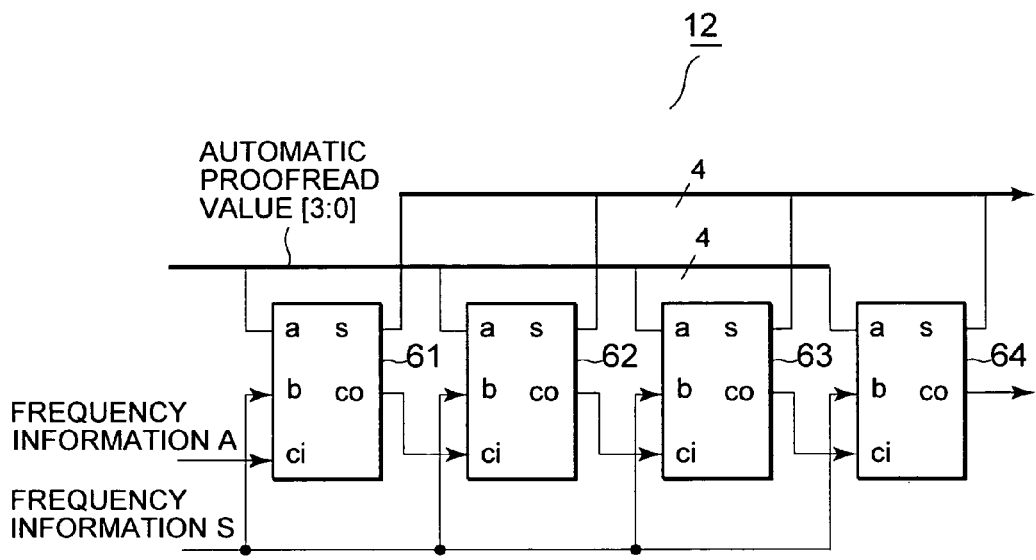
FIG. 5 is a block diagram showing a full adder of the first embodiment of the present invention.
FIG. 6 is a table showing an example relationship between an oscillation frequency and frequency information.

FIG. 5 is a circuit diagram showing the full adder 12. The full adder 12 includes first to fourth four-bit adders 61 to 64. The automatic proofreading value includes the first bit to the fourth bit. The first bit of the automatic proofreading value is inputted into input a of the first four-bit adder 61. The second bit of the automatic proofreading value is inputted into input ci of the second four-bit adder 62. The third bit of the automatic proofreading value is inputted into input a of the third four-bit adder 63. The fourth bit of the automatic proofreading value is inputted into input a of the fourth four-bit adder 64. A frequency information A is inputted into inputs b of the first to fourth four-bit adder 61-64. A frequency information S is inputted into a carry input ci of the first four-bit adders 61. The four bit logical synthesized data (cal [3:0] in FIG. 5) are obtained from sum outputs s of the first to fourth four-bit adders 61 to 64. A curry output co of the first four-bit adder 61 is connected to the carry input ci of the second four-bit adder 62. The curry output co of the second four-bit adder 62 is connected to the carry input ci of the third four-bit adder 63. The curry output co of the third four-bit adder 63 is connected to the carry input ci of the fourth four-bit adder 64.

The frequency information [1:0] 13 consists of 2 bits data including the frequency information A and the frequency information S as shown in a table of FIG. 6. Namely, only when frequency information is (01), the frequency information S of the full adder 12 is set to "1". The frequency information A of the full adder 12 is set to "1" only when frequency information is (11).

The trimming capacitors 11 and the variable capacitor 18 consist of an NMOS transistor. The trimming capacitor 11 has a minimum capacitance, when the applied voltage is 0V (namely, the control data (B3, B2, B1, B0)=(0, 0, 0, 0)), and when the applied voltage is equal to the power supply voltage (at namely, the control data (B3, B2, B1, B0)=(1, 1, 1, 1)), the trimming capacitor 11 has a maximum capacitance. The capacitance change is about 0.02 pF per bit, and varies in a range of about 0.01 pF to 0.03 pF. The capacitance of one trimming capacitor is about 0.30 pF and varies in a range of 0.15 pF to 0.45 pF due to the element variation.

The variation capacitor 18 has a minimum capacitance, when the applied voltage is 0V, and when the applied voltage is equal to the power supply voltage (at namely, the control data (B3, B2, B1, B0)=(1, 1, 1, 1)), the trimming capacitor 11 has a maximum capacitance. The capacitance of the variation capacitor 18 is about 0.08 pF and varies in a range of 0.04 pF to 0.12 pF due to the element variation.

Inductor 19*a* has an inductance of 1 nH and a series resistance of 4 ohms. Buffer circuit 19*c* is connected through a capacitor having a capacitance of 0.1 pF in series to the LC resonator which consists of the inductor 19*a*, the variable capacitor 18 and the trimming capacitors 11. The output of the VCO 40 is an output of the buffer circuit 19*c*.

An operation of the VCO of the first preferred embodiment is explained in detail hereafter.

Figure 7:
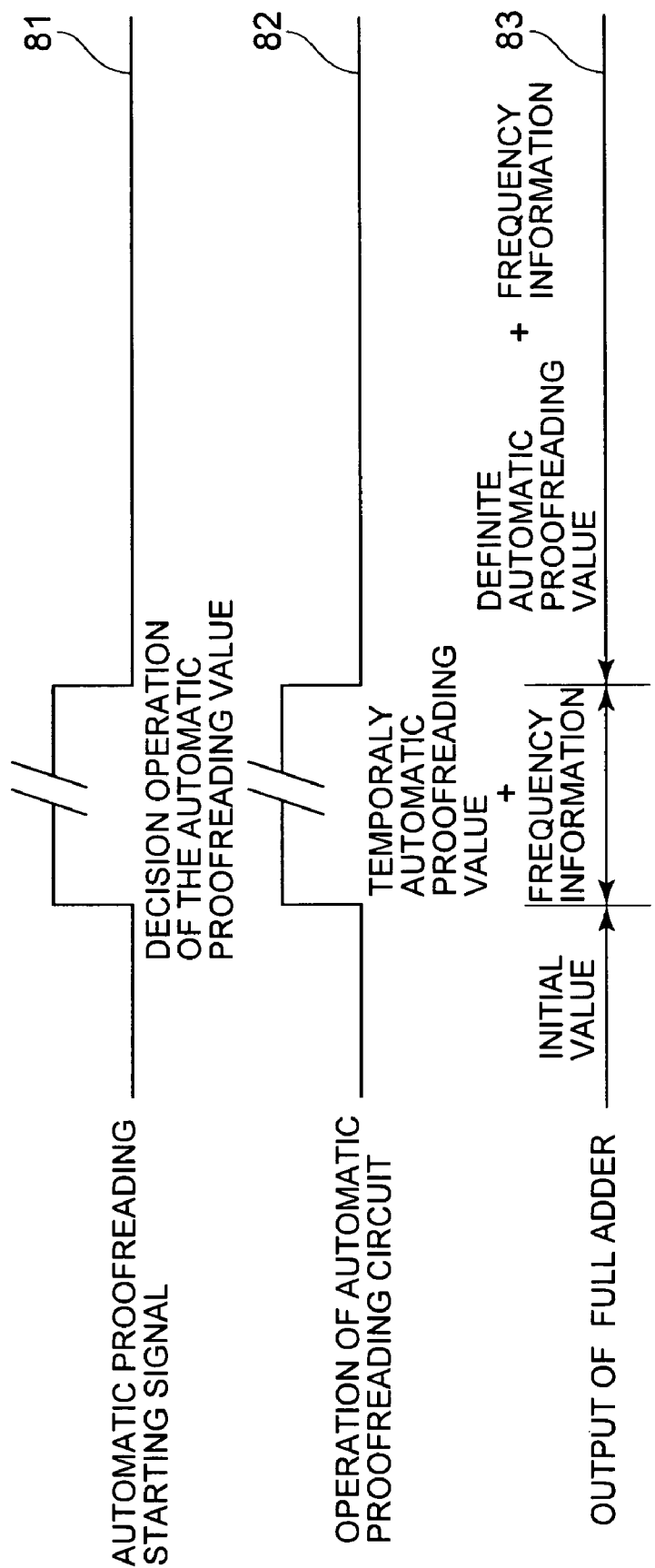
FIG. 7 is a timing chart showing an order of a determination of the automatic proofreading value and a synthesis of the automatic proofreading value and oscillation frequency information.

FIG. 7 is a figure having shown the order of composition of the determination of an automatic proofreading value and the automatic proofreading value resulting from element variation, and oscillation frequency information.

When the VCO 10 and the phase synchronous loop 40 start, the automatic proofreading starting signal 81 is set to "1", and the value of 4 bits (automatic proofreading value) of the optimal trimming capacitor for compensating element variation is determined (82).

The designated oscillation frequency (a frequency decided by the division ratio set up in the divider 45 of FIG. 3) is a fixed value during a decision operation of the automatic proofreading value. For example, where the value set up to the register 45 is 4900 and the oscillation frequency is 1 MHz, the designated oscillation frequency is set to 4900 MHz. Further, during the decision operation of the automatic proofreading value, a higher rank of a binary number of the automatic proofreading value is decided and finally all of four bits of the automatic proofreading value is decided, for example, such as N=8 (1000)→4 (0100)→6 (0110)→7 (0111) (refer to FIG. 4)

The full adder 12 logically synthesize a temporary automatic proofreading value or a definite automatic proofreading value with the frequency information corresponding to the oscillation frequency irrespective of the state of the VCO (before automatic proofreading, under automatic proofreading operation, after an automatic proofreading end) (83).

Since according to FIG. 6, the oscillation frequency information is (00) when the designated oscillation frequency is 4860-4919 MHz, an operation to full adder 12 is not performed, but the 4 bits output of the full adder 12 is the same as that of the automatic proofreading value N. At this time, the VCO shows a characteristic of the frequency curve 92 shown in FIG. 8.

Since according to FIG. 6, the oscillation frequency information is (11) when the designated oscillation frequency is 4800-4859 MHz, the full adder output data that is added 1 to the automatic proofreading value N. In this case, the VCO shows a characteristic of the frequency curve 93 shown in FIG. 9. Therefore, the designated oscillation characteristic can be obtained in the central part of a control voltage range. The reason why the frequency curve shifts from the curve 92 to the curve 93 is the 4-bit data applied to the trimming capacitors 11 becomes large by 1 bit and a capacitance of the trimming capacitors 11 increases.

Since according to FIG. 6, the oscillation frequency information is (01) when the designated oscillation frequency is equal to or more than 4920 MHz, each bit of the output data of the full adder 12 is added to "1", (that is, "−1" is added to the data of the output data), and the value which subtracted 1 from the automatic proofreading value N is outputted from the full adder 12. In this case, since the VCO shows the characteristic of the frequency curve 91 shown in FIG. 8, the designated oscillation characteristic can be obtained in the central part of a control voltage range. The reason why the frequency curve shifts from the curve 92 to the curve 91 is the 4-bit data applied to the trimming capacitors 11 becomes small by 1 bit and a capacitance of the trimming capacitors 11 decreases.

As described above, according to the first preferred embodiment, the following advantages are obtained. Since the capacitance of the trimming capacitors controllable by the digital signal is determined based on the automatic proofreading value and the designated frequency information, a number of the trimming capacitors can be decreased. Since a floating capacitance of each trimming capacitors decreases, a switching of the frequency curve can be done with sufficient reproducibility in the LC type VCO using trimming capacitors with a small capacitance.

(2) Second Embodiment

Figure 9:
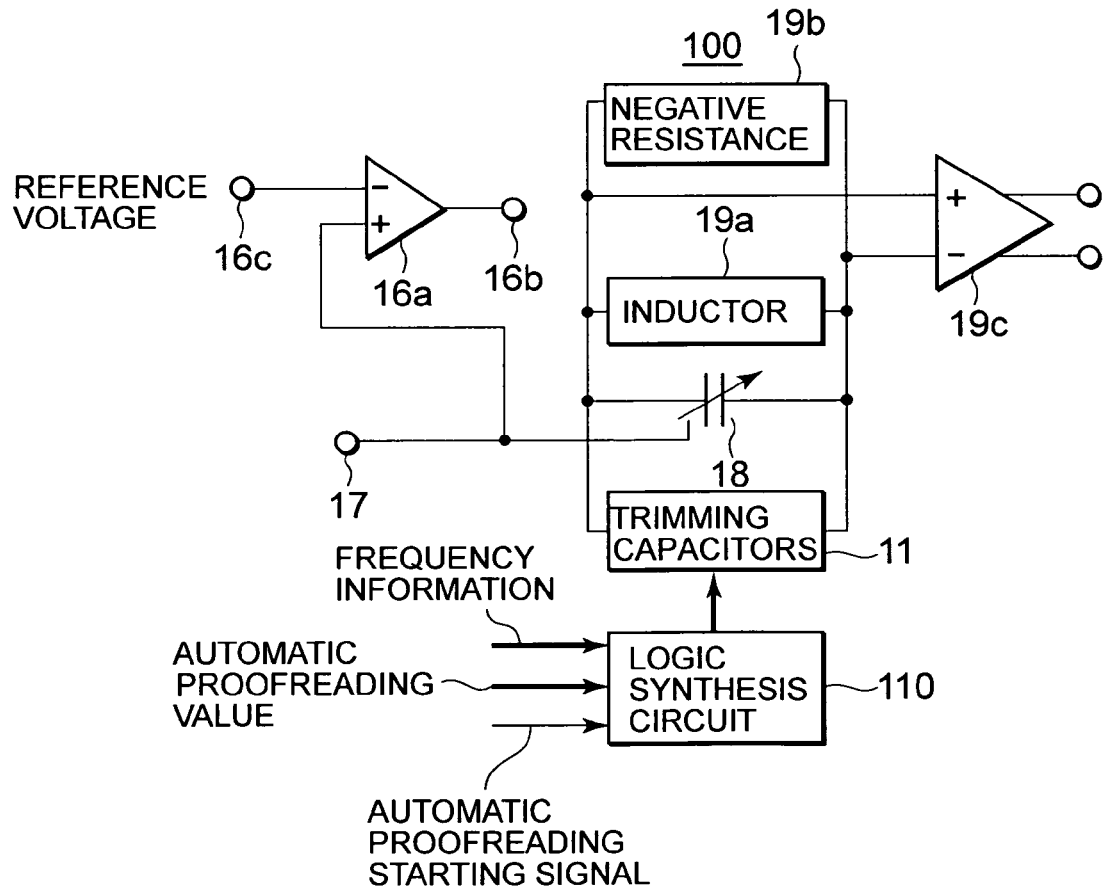
FIG. 9 is a circuit diagram showing a VCO of a second embodiment of the present invention.

FIG. 9 is a circuit diagram showing a VCO of a second embodiment of the present invention. The VCO 100 according to the second embodiment includes the logic synthesis circuit 110 instead of the full adder 12 in the first embodiment. Other circuit elements are same to the first embodiment and its explanation is omitted.

Figure 10:
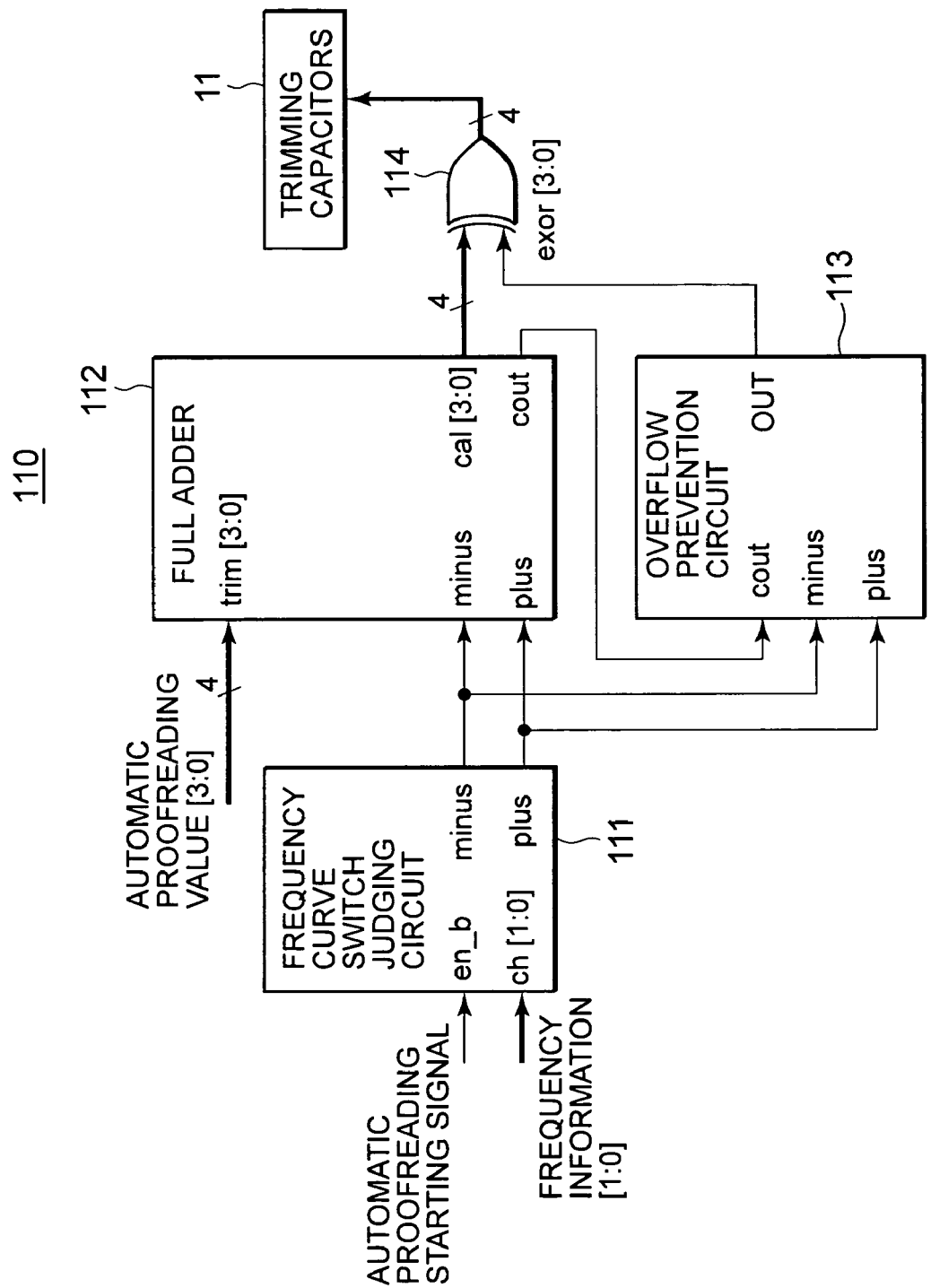
FIG. 10 is a block diagram showing a logic synthesis circuit of the second embodiment of the present invention.

FIG. 10 is a block diagram showing the logic synthesis circuit of the second embodiment. The logic synthesis circuit 110 includes a frequency curve switch judging circuit 111, a full adder 112, an overflow prevention circuit 113 and an exclusive OR (EXOR) circuit 114 (that includes four circuits, but one is described as a representative).

FIG. 11 is a circuit diagram showing the frequency curve switch judging circuit. The frequency curve switch judging circuit 111 includes an inverter 111a, a first AND gate 111b and a second AND gate 111c. As shown in FIG. 10, the frequency curve switch judging circuit 111 receives the automatic proofreading starting signal en_b and the frequency information ch[1:0]. The frequency information ch[1:0] is a 2 bit data that includes a first frequency information signal ch[1] and a second frequency information signal ch[0]. The frequency information ch[1:0] is the same to that explained in FIG. 6 and its explanation is omitted.

The inverter 111a receives the first frequency information signal ch[1]. The first AND gate 111b receives the automatic proofreading starting signal en_b at its inverting input terminal and the second frequency information signal ch[0] at its first non-inverting input terminal. A second non-inverting input terminal of the first AND gate 111b is connected to the output terminal of the inverter 111a. The second AND gate 111c receives the automatic proofreading starting signal en_b at its non-inverting input terminal and the first frequency information signal ch[1] at its inverting input terminal. The first AND gate 111b outputs a first output signal minus and the second AND gate 111c outputs a second output signal plus.

When automatic proofreading starting signal en_b is effective ("0"), according to specification frequency, the output signals minus and plus as shown in FIG. 12 are outputted. When en_b is invalid ("1"), both of the output signals minus and plus output "0." The relationship of the signals used in the frequency curve switch judging circuit 111 is described in a table shown in FIG. 15.

FIG. 13 is a circuit diagram showing the full adder 112 included in the logic synthesis circuit 110 shown in FIG. 10. The full adder 112 includes first to fourth four-bit adders 161 to 164. The automatic proofreading value trim [3:0] includes the first bit (LSB) to the fourth bit (MSB). The first bit of the automatic proofreading value is inputted into input a of the first four-bit adder 161. The second bit of the automatic proofreading value is inputted into input a of the second four-bit adder 162. The third bit of the automatic proofreading value is inputted into input a of the third four-bit adder 163. The fourth bit of the automatic proofreading value is inputted into input a of the fourth four-bit adder 164. The first output signal minus is inputted into inputs b of the first to fourth four-bit adder 161-164. The second output signal plus is inputted into a carry input ci of the first four-bit adders 161. The four bit logical synthesized data (cal [3:0] in FIG. 5) are obtained from sum outputs s of the first to fourth four-bit adders 161 to 164. A curry output co of the first four-bit adder 161 is connected to the carry input ci of the second four-bit adder 162. The curry output co of the second four-bit adder 162 is connected to the carry input ci of the third four-bit adder 163. The curry output co of the third four-bit adder 163 is connected to the carry input ci of the fourth four-bit adder 164. A carry signal cout output from the fourth four-bit adder 164 is transferred to the overflow prevention circuit 113.

Figure 14:
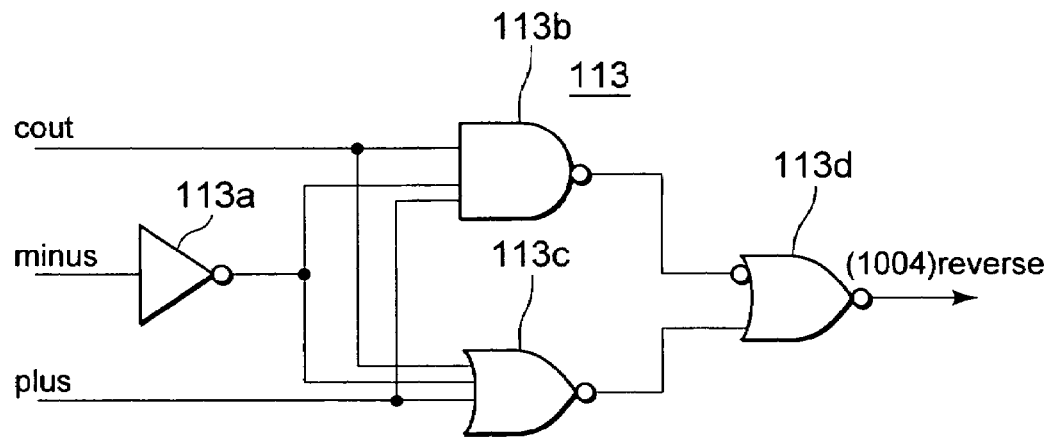
FIG. 14 is a circuit diagram showing an overflow prevention circuit included in the logic synthesis circuit shown in FIG. 10.

FIG. 14 is a circuit diagram showing an overflow prevention circuit 113 included in the logic synthesis circuit 110 shown in FIG. 10.

The overflow prevention circuit 113 includes an inverter 113a, an AND gate 113b, a first OR circuit 113c and a second OR gate 113d.

The inverter 113a receives one of the first output signal minus of the frequency curve switch judging circuit 111. The AND gate 111b receives the carry signal cout at its first input terminal, an output signal of the inverter 113a at its second input terminal and one of the second output signal plus of the frequency curve switch judging circuit 111 at its third input terminal. The first OR gate 111c receives the carry signal cout at its first input terminal, the output signal of the inverter 113a at its second input terminal and the second output signal plus at its third input terminal. Both of output terminals of the AND gate 113b and the first OR gate 113c are connected to input terminals of the second OR gate 113d. The second OR gate 113d outputs a signal as the second output signal of the overflow prevention circuit 113.

The operation of the overflow prevention circuit 113 is described hereafter. For example, when the signal plus is "1" and the carry signal cout is "1", the output signal of the overflow prevention circuit 113 is "1". The carry signal cout is "0" and plus is "1", the overflow prevention circuit 113 operates so that the output signal thereof is set to "0."

An operation of the VCO of the second preferred embodiment is explained in detail hereafter using FIG. 9.

When the definite value of the automatic proofreading value N after a power-on operation is 0 (0000), the frequency curve of the VCO is in the highest frequency side (frequency curve 91 shown in FIG. 9). In this case, since the frequency curve which should move does not exist even if the frequency of 4920 MHz or more is specified as oscillation frequency, the VCO of the third embodiment maintains the present frequency curve.

Figure 15:
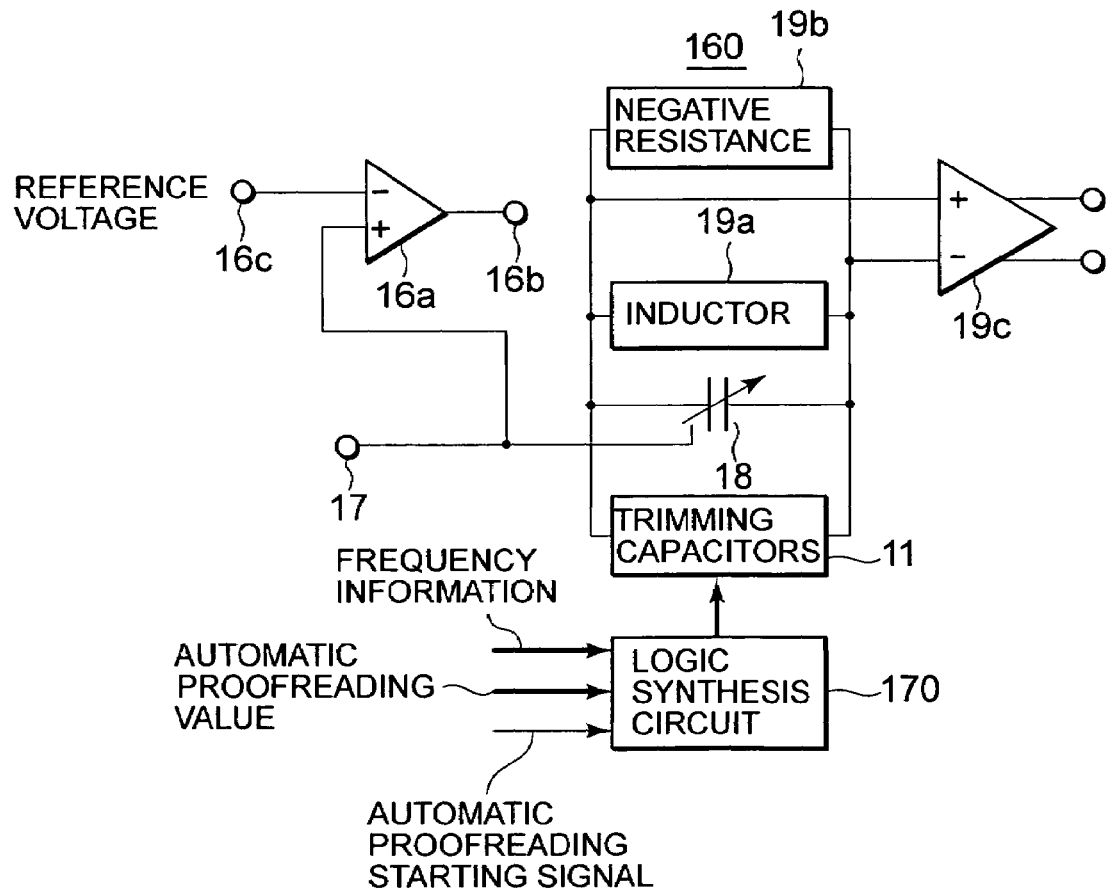
FIG. 15 is a circuit diagram showing a VCO of a third embodiment of the present invention.

That is, if the oscillation frequency of 4920 MHz or more is specified, as shown in FIG. 15, the first output signal minus of the frequency curve switch judging circuit is set to "1." In this case, since the full adder 112 adds "1" to each bit, the output signal cal[3:0] becomes (1111) and the carry signal cout turns "0." If four bits output signal of addition results of the full adder 112 are directly given to the trimming capacitor, the oscillation frequency curve moves to the frequency curve 93 from the frequency curve 91 corresponding to N=(0000). Therefore, the VCO cannot provide the appointed frequency.

In the above situation, since the carry signal cout is "0", the first output signal minus is "1" and the second output signal plus is "0", the output signal of the overflow prevention circuit 113 turn "1", and the EXOR circuit 114 receives signal "1". Since the output signal of the full adder 112 (cal [3:0]) gives "1" to the EXOR circuit 114, at this time, the data supplied to the trimming capacitor 11 is still (0000). That is, a frequency curve remains in the highest frequency side.

When the definite of automatic proofreading value N is (1111), the frequency curve is in the minimum frequency side. Since there is no low cycle side curve which should move even if the designated oscillation frequency is in the range which is 4800 to 4859 MHz, the VCO maintains the present frequency curve as it is. As shown in FIG. 15, the second output signal plus of the frequency curve switch judging circuit 111 is set to "1" because the designated oscillation frequency is in the range of 4800 to 4859 MHz. The full adder 112 adds "1" to the LSB adder 161, the output signal cal[3:0]=(0000) and the carry signal cout is turned to "1." If the output data of the full adder 112 is transferred to the trimming capacitor 11, the oscillation frequency curve moves to the highest frequency side from the minimum frequency side, and the VCO cannot provide the designated frequency signal.

In the above situation, since the carry signal cout is "1", the first output signal minus is "0" and the second output signal plus is "1", the output signal of the overflow prevention circuit 113 turn "1", and the EXOR circuit 114 receives signal "1". Since the output signal of the full adder 112 (cal [3:0]) gives "0" to the EXOR circuit 114, at this time, the data supplied to the trimming capacitor 11 is still (111). That is, a frequency curve remains in the highest frequency side.

When the output of the overflow prevention circuit 113 is "0", i.e., the designated oscillation frequency is in the range of 4860 to 4919 MHz, or the addition result of the full adder 112 has not caused overflow, the output of EXOR circuit 114 is in agreement with the output of the full adder 112.

As explained above, the following effects are obtained in the second preferred embodiment.

When the automatic proofreading value N for the element variation compensation is 0 or 15, that is, when the frequency curve is decided to the highest or minimum frequency side in the previous VCO, a problem that desired oscillation frequency is not obtained arises due to the frequency curve moving to the minimum frequency side from the highest frequency side or due the frequency curve moving to the highest frequency side from the minimum frequency side. According to the logic synthesis circuit of the second embodiment, when a frequency curve is in the highest frequency side, even if the frequency curve switch judging circuit designates the curve by the side of high frequency further, the frequency curve does not move but maintains the state which can be oscillated by the phase synchronous loop. Similarly, when the frequency curve is in the minimum frequency side, even if a frequency curve switch judging circuit designates the curve by the side of a low cycle further, the frequency curve does not move but maintains the state which can be oscillated by the phase synchronous loop. According to the above effect, even if it is the circuit where the automatic proofreading value for the element variation compensation becomes 0 or 15, there is no necessity for abandonment, and the production yield improves.

(3) Third Embodiment

FIG. 15 is a circuit diagram showing a VCO of a third embodiment of the present invention. The VCO 160 according to the second embodiment includes the logic synthesis circuit 170 instead of the full adder 12 in the first embodiment. Other circuit elements are same to the first embodiment and its explanation is omitted.

Figure 16:
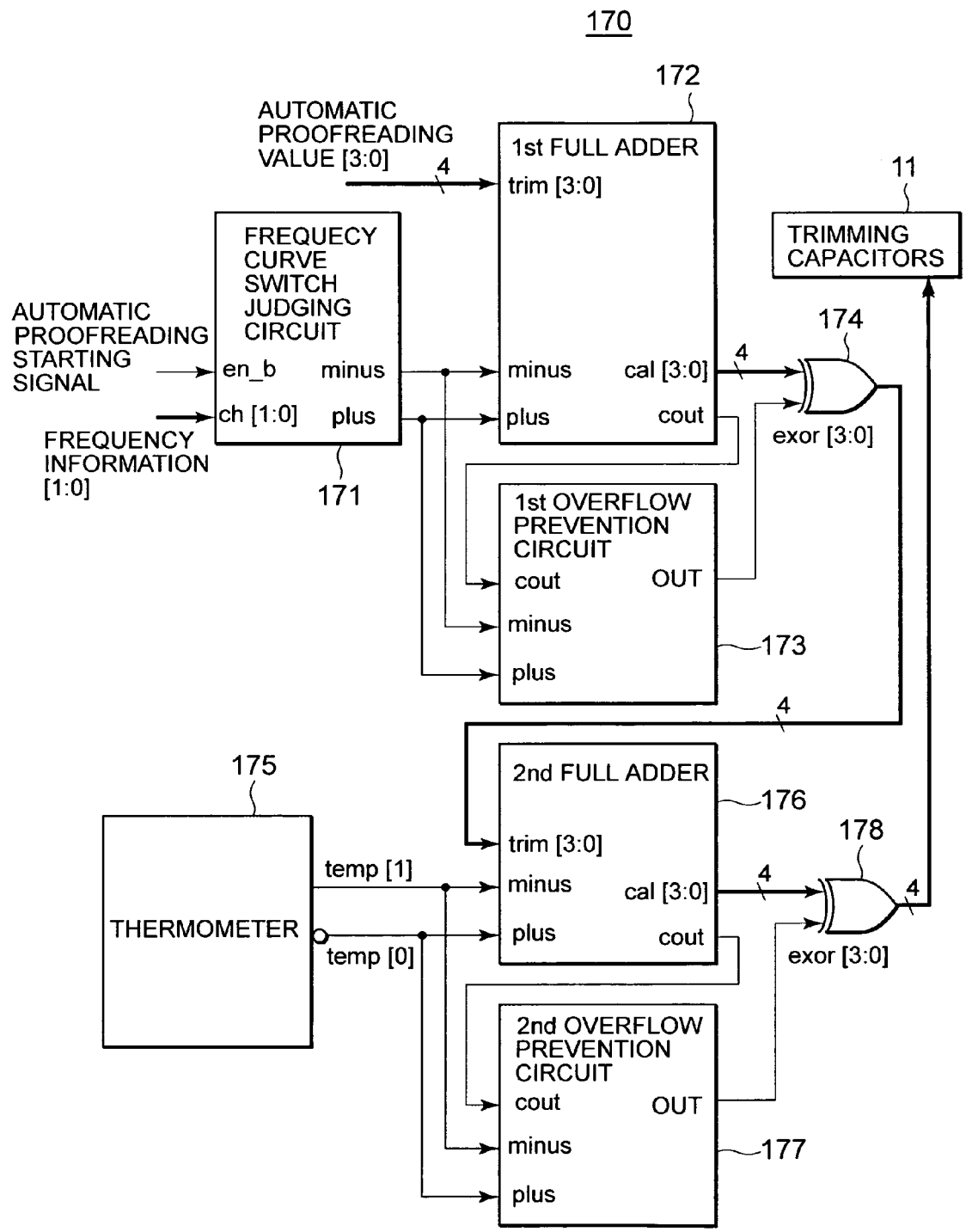
FIG. 16 is a block diagram showing a logic synthesis circuit of the third embodiment of the present invention.

FIG. 16 is a block diagram showing the logic synthesis circuit 170 of the third embodiment of the present invention. The logic synthesis circuit 170 includes a frequency curve switch judging circuit 171, a first full adder 172, a first overflow prevention circuit 173, a first exclusive OR (EXOR) circuit 174 (that includes four circuits, but one is described as a representative), a thermometer 175, a second full adder 176, a second overflow prevention circuit 177, and a second EXOR circuit 178 (that includes four circuits, but one is described as a representative). The detailed circuit diagram of the frequency curve switch judging circuit 171, the first and the second full adder 172 and 176, the first and the second overflow prevention circuit 173 and 177 are the same as that of the frequency curve switch judging circuit 111, the full adder 112, and the overflow prevention circuit 113, respectively. Therefore, the explanation of the above circuit is omitted.

In the third embodiment, a connection and an operation of the frequency curve switch judging circuit 171, the first full adder 172, the first overflow prevention circuit 173 and the input of the first EXOR circuit are the same to the frequency curve switch judging circuit 111, the full adder 112, and the overflow prevention circuit 113. However, an output of the first EXOR circuit 174 is connected to the input (trim [3:0]) of the second full adder 176. The thermometer 175 has a first output terminal (temp [1]) and a second output terminal (temp [2]). The first and second output terminals of the thermometer 175 are connected to the input terminals (minus and plus) of the second full adder 176 and the second overflow prevention circuit 177. The second EXOR circuits 178 receive four bit output signal 8 cal [3:0] from the second full adder 176 and an output signal from the second overflow prevention circuit 177. Four bit output signal of the second EXOR circuits 178 is transferred to the trimming capacitors 11. A carry signal of the second full adder 176 is inputted to the input (cout) of the second overflow prevention circuit 177.

Figures 17, 18:
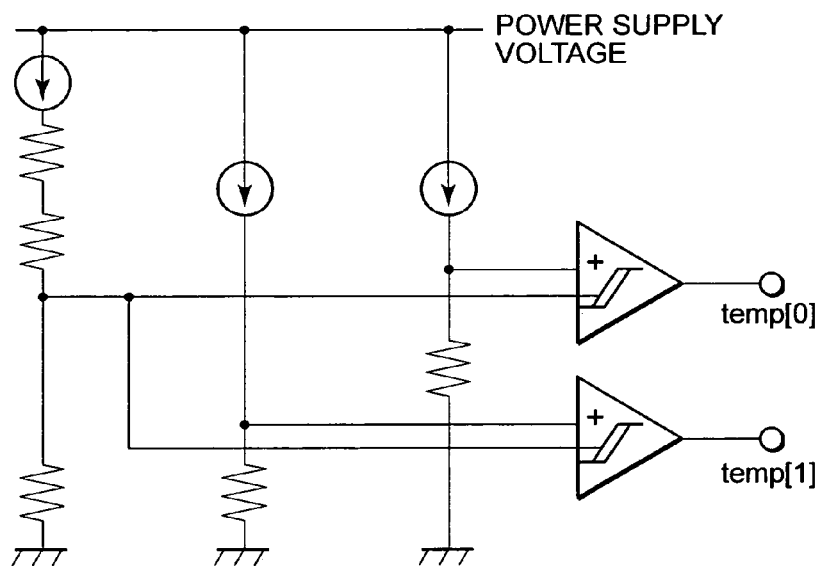
FIG. 17 is a table showing the output signals of a thermometer shown in FIG. 16.
FIG. 18 is a circuit diagram showing the thermometer shown in FIG. 16.

FIG. 18 is a circuit diagram of the thermometer 175 shown in FIG. 16. The thermometer 175 includes current sources I1 through I3, resistors R1 through R3 and voltage comparators C1 and C2. The current source I1 is a current source independent on the temperature, i.e., a current source that outputs a predetermined current without depending on the temperature. The resistor R1 is connected in series with the current source I1 with resistors interposed therebetween as needed. A voltage applied across the resistor R1 is outputted to the voltage comparators C1 and C2. The voltage applied across the resistor R1 is calculated based on the product of the resistance value of the resistor R1 and the output current of the current source I1. Since the output current does not depend on the temperature, the voltage applied across the resistor R1 does not depend on the temperature either.

The current sources I2 and I3 are current sources each of which outputs a current proportional to the absolute temperature. The resistors R2 and R3 are connected in series with the current sources I2 and I3 respectively.

A voltage applied across the resistor R2 is inputted to the voltage comparator C2. The voltage applied across the resistor R2 is equivalent to the product of the resistance value of the resistor R2 and the output current of the current source I2. Since the output current is proportional to the absolute temperature, the voltage applied across the resistor R2 is also proportional to the absolute temperature. The resistor R2 is selected in such a manner that the voltage applied across the resistor R2 becomes equal to the voltage applied across the resistor R1 at a temperature 350K.

A voltage applied across the resistor R3 is inputted to the voltage comparator C1. The voltage applied across the resistor R3 is equivalent to the product of the resistance value of the resistor R3 and the output current of the current source I3. Since the output current is proportional to the absolute temperature, the voltage applied across the resistor R3 is also proportional to the absolute temperature. The resistor R3 is selected in such a manner that the voltage applied across the resistor R3 becomes equal to the voltage applied across the resistor R1 at a temperature 290K.

The voltage comparator C2 outputs a second temperature compensation signal (temp[1]) for raising the oscillation frequency band when the temperature rises. In the present embodiment, when the temperature rises beyond 350K (a first threshold value), the output of the voltage comparator C2 is inverted from low: "0" to high: "1" as shown in a table shown in FIG. 17. The voltage comparator C2 has a hysteresis characteristic with respect to the input such that when the temperature is lowered and falls below 350K, the second temperature compensation signal (temp [1]) is inverted from high to low at a temperature lower than 350K.

The voltage comparator C1 outputs a first temperature compensation signal (temp [0]) for lowering the oscillation frequency band when the temperature rises. In the present embodiment, when the temperature is reduced below 320K (a second threshold value), the output of the voltage comparator C1 is inverted from high: "1" to low: "0" as shown in FIG. 18. The voltage comparator C1 has a hysteresis characteristic with respect to the input such that when the temperature is raised and falls beyond 320K, the first temperature compensation signal (temp [0]) is inverted from low to high at a temperature higher than 320K.

Incidentally, although the current sources for outputting the currents proportional to the absolute temperature, and the resistors and voltage comparators connected in series with them are provided in two pairs in FIG. 18, they may be increased within the range of the upper limit value of the graduation of the temperature compensation of the VCO.

The current source I1 independent on the temperature is one for generating a reference voltage independent on the temperature may be substituted with a voltage source independent on the temperature.

An operation of the voltage controlled oscillator according to the third embodiment is described hereafter.

In the third embodiment, four bits output signal of the EXOR circuit 174 is inputted into the input terminal (trim [3:0]) of the second full adder 176. When temperature is a low-temperature less than, for example, 290 degrees K, a reversed signal of the first output signal (temp [0]) of the thermometer 175 (temp [0]="0") is inputted into the carry input terminal (Ci) of the LSB adder of the second full adder 176. The output of the second full adder 176 is inputted into the trimming capacitor 11 through the EXOR circuit 178. In this case, the capacitance of the trimming capacitors increase by 1 bit, and the frequency curve moves to the low frequency side.

Generally the frequency curve of LC oscillation circuit moves to the high frequency side with a temperature fall. The reason is because (1) a junction conductance of a transistor connected to the LC circuit is decreased with a temperature fall and (2) a mutual conductance of a transistor which constitutes the negative resistance goes up, and a frequency at which an oscillated amplitude is saturated becomes high. Therefore, when the capacitance of the trimming capacitors increase with a temperature fall, the temperature change of the frequency curve will be compensated.

When temperature becomes a high temperature, for example, 350 degrees K, since the output signal (temp [1]) of the thermometer 175 gives "1" to the inputs of each of the adders of the second full adder 176 ("1" is subtracted namely), the signal applied to the trimming capacitors 11 is reduced only for 1. In this case, since the capacitance of the trimming capacitors 11 becomes small by 1 bit, the frequency curve moves to the high frequency side. Since the frequency curve of the LC oscillation circuit moves to the low frequency side with the temperature rise, the temperature change of the frequency curve is compensated by reduction of the trimming capacitor.

Figure 8:
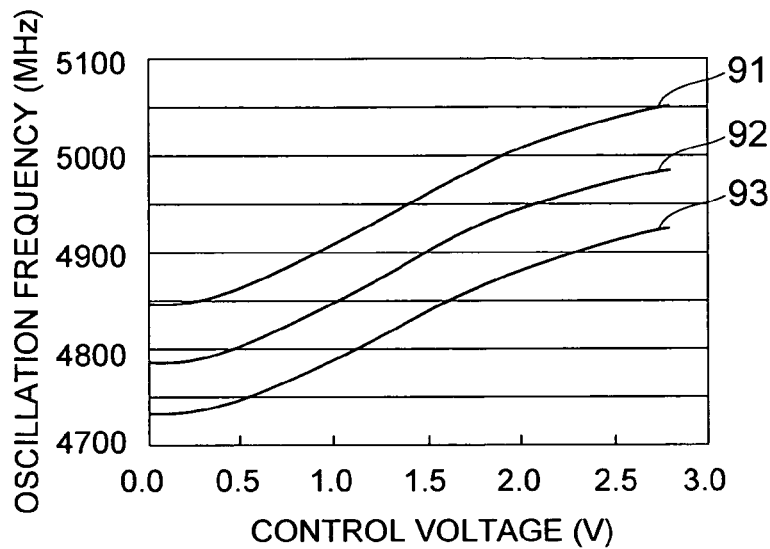
FIG. 8 is a graph showing an example of the frequency characteristic (control voltage pair oscillation frequency characteristic) of the VCO.

In case the output of the first EXOR circuit 174 is (0000), the frequency curve cannot move to the high frequency side any longer, even if it is in the highest frequency side (for example, frequency characteristic shown as the curve 91 in FIG. 8) and temperature rises. In this case, if the output of the second full adder 176 is inputted into the trimming capacitors 11, since the output of the second full adder 176 is (1111) and the oscillation frequency of the VCO will move from the highest frequency side to the minimum frequency side. Therefore, the designated oscillation frequency should not be reached.

In the third embodiment, the output of the second overflow prevention machine 177 is set to "1" by the same operation as the second embodiment by inputting the output of the second full adder 176 into the input terminal cout of the second overflow prevention machine 177. Consequently, the output of the second EXOR circuit 178 maintain the value of (0000).

Similarly, when the output of the second EXOR circuit 178 is (1111), the frequency curve cannot move to the low frequency side any longer, even if it is in the minimum frequency side (for example, frequency characteristic shown as the curve 93 in FIG. 8) and temperature falls. In this case, if the output of the second full adder 176 is inputted into the trimming capacitors 11, since the output of the second full adder 176 is (0000) and the oscillation frequency of the VCO will move from the highest frequency side to the minimum frequency side. Therefore, the designated oscillation frequency should not be reached.

In the third embodiment, the output of the second overflow prevention machine 177 is set to "1" by the same operation as the second embodiment by inputting the output of the second full adder 176 into the input terminal cout of the second overflow prevention machine 177. Consequently, the output of the second EXOR circuit 178 maintain the value of (1111).

Although the detection temperatures of the thermometer 175 was set as 290 degrees K, 320 degrees K, and 350 degrees K in the third embodiment, it is possible to set to a suitable value according to the temperature characteristic of the VCO. Detection temperatures are changed by fluctuating resistances of the resistors R2 and R3 shown in FIG. 18.

As explained above, according to the third embodiment, there are the following effects.

The capacitance of the trimming capacitors is determined based on the automatic proofreading value N, frequency information, and thermometer information, and there is no necessity of preparing the trimming capacitor for temperature compensation separately. Therefore, a number of the trimming capacitors can be reduced compared with the conventional technology.

Since the floating capacitance accompanying each of the trimming capacitors decreases compared with the conventional technology, in the LC type VCO with small capacity, it becomes possible to realize following three functions:

(1) A changing function of the good frequency curve of reproducibility,
(2) A function to compensate change of the frequency curve by element manufacture variation, and
(3) A function to compensate the temperature dependency of an oscillation frequency curve.

When the frequency curve is in the highest frequency side, even if the curve of the high frequency side is further designated by the temperature data, the frequency curve does not move but maintains the state which can be oscillated by the phase synchronous loop. Similarly, when the frequency curve is in the minimum frequency side, even if the curve of the frequency side is further designated by temperature data, the frequency curve does not move but maintains the state which can be oscillated by the phase synchronous loop. Consequently, even if it is the circuit where the value of the automatic proofreading value for the element variation compensation becomes 0 or 15, there is no necessity for abandonment, and the production yield improves.

According to the oscillation circuit of the present invention, since a number of required trimming capacitors can be decreased compared with the conventional technology, the change of the frequency curve of the high frequency LC oscillation circuit, element variation compensation, and temperature change compensation are attained.

What is claimed is:

1. A voltage controlled oscillator comprising:
    a resonant circuit including a negative resistor, an inductor and an oscillation frequency setting capacitor having a variable capacitance according to a controlled voltage based on a oscillation frequency data;
    a trimming capacitor connected in parallel to the oscillation frequency setting capacitor, the trimming capacitor having a plurality of capacitors each of which having a variable capacitance according to an input signal thereof;
    a full adder connected to the trimming capacitor, the full adder generating the input signal based on a frequency information and an automatic proofreading value received thereto.

2. A voltage controlled oscillator according to claim 1, wherein the resonant circuit further includes a buffer circuit.

3. A voltage controlled oscillator according to claim 1, further comprising a monitor circuit connected to receive the controlled voltage, the monitor circuit outputting a monitor output based on a comparison of the controlled voltage and a reference voltage.

4. A voltage controlled oscillator according to claim 1, wherein the full adder including a plurality of adders.

5. A voltage controlled oscillator according to claim 1, wherein the full adder receiving the automatic proofreading value having a plurality of bits and the frequency information having a plurality of bits.

6. A voltage controlled oscillator according to claim 1, wherein the voltage controlled oscillator changes its frequency curve based on the frequency information and the automatic proofreading value.

7. A voltage controlled oscillator comprising:
    a resonant circuit including a negative resistor, an inductor and an oscillation frequency setting capacitor having a variable capacitance according to a controlled voltage based on a oscillation frequency data;
    a trimming capacitor connected in parallel to the oscillation frequency setting capacitor, the trimming capacitor having a plurality of capacitors each of which having a variable capacitance according to an input signal thereof;
    a logic synthesis circuit connected to the trimming capacitor, the logic synthesis circuit generating the input signal based on a frequency information, an automatic proofreading value and an automatic proofreading staffing signal received thereto;
    wherein the logic synthesis circuit includes a frequency curve switching circuit, a full adder connected to the frequency curve switching circuit and an overflow prevention circuit connected to the frequency curve switching circuit.

8. A voltage controlled oscillator according to claim 7, wherein the resonant circuit further includes a buffer circuit.

9. A voltage controlled oscillator according to claim 7, further comprising a monitor circuit connected to receive the controlled voltage, the monitor circuit outputting a monitor output based on a comparison of the controlled voltage and a reference voltage.

10. A voltage controlled oscillator according to claim 7, wherein the full adder includes a plurality of adders.

11. A voltage controlled oscillator according to claim 7, wherein the voltage controlled oscillator changes its frequency curve based on the frequency information, the automatic proofreading value and the automatic proofreading starting signal.

12. A voltage controlled oscillator comprising:
   a resonant circuit including a negative resistor, an inductor and an oscillation frequency setting capacitor having a variable capacitance according to a controlled voltage based on a oscillation frequency data;
   a trimming capacitor connected in parallel to the oscillation frequency setting capacitor, the trimming capacitor having a plurality of capacitors each of which having a variable capacitance according to an input signal thereof;
   a logic synthesis circuit connected to the trimming capacitor, the logic synthesis circuit generating the input signal based on a frequency information, an automatic proofreading value and an automatic proofreading starting signal received thereto;
   wherein the logic synthesis circuit includes,
   a frequency curve switch judging circuit for receiving the automatic proofreading starting signal and the frequency information,
   a full adder connected to the frequency curve switch judging circuit for receiving the automatic proofreading value,
   an overflow prevention circuit connected to the frequency curve switch judging circuit and the full adder, and
   an exclusive OR circuit connected to the full adder and the overflow prevention circuit.

13. A voltage controlled oscillator according to claim 12, wherein the frequency curve switch judging circuit includes an inverter and a plurality of gate circuits.

14. A voltage controlled oscillator according to claim 12, wherein the overflow prevention circuit includes an inverter and a plurality of gate circuits.

15. A voltage controlled oscillator according to claim 12, wherein the logic synthesis circuit further includes a thermometer.

16. A voltage controlled oscillator according to claim 15, wherein the thermometer outputs a signal in response to a temperature detected thereto.

17. A voltage controlled oscillator according to claim 15, wherein the thermometer includes a plurality of current sources, a plurality of resistors and a plurality of voltage comparators.

* * * * *